(12) United States Patent
Furuta et al.

(10) Patent No.: US 11,876,055 B2
(45) Date of Patent: Jan. 16, 2024

(54) SEMICONDUCTOR DEVICE AND SEMICONDUCTOR WAFER

(71) Applicant: LAPIS Semiconductor Co., Ltd., Yokohama (JP)

(72) Inventors: Kenichi Furuta, Yokohama (JP); Masao Tsujimoto, Yokohama (JP); Nobuhiro Terada, Yokohama (JP); Masahiro Haraguchi, Yokohama (JP); Tsuyoshi Inoue, Yokohama (JP); Yuuichi Kaneko, Yokohama (JP); Hiroki Kuroki, Yokohama (JP); Takaaki Kodaira, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 95 days.

(21) Appl. No.: 17/507,361

(22) Filed: Oct. 21, 2021

(65) Prior Publication Data

US 2022/0130772 A1 Apr. 28, 2022

(30) Foreign Application Priority Data

Oct. 23, 2020 (JP) .................. 2020-178408

(51) Int. Cl.
*H01L 21/762* (2006.01)
*H01L 21/76* (2006.01)
*H01L 23/00* (2006.01)

(52) U.S. Cl.
CPC ........ *H01L 23/562* (2013.01); *H01L 21/7602* (2013.01); *H01L 21/76232* (2013.01)

(58) Field of Classification Search
None
See application file for complete search history.

(56) References Cited

U.S. PATENT DOCUMENTS

| 2004/0188845 | A1* | 9/2004 | Iguchi | H01L 23/5226 257/E23.145 |
| 2014/0138833 | A1* | 5/2014 | Seng | H01L 24/05 257/751 |
| 2016/0308270 | A1* | 10/2016 | Ding | H01L 21/76224 |

FOREIGN PATENT DOCUMENTS

| JP | 2004063860 A | * | 2/2004 |
| JP | 2014-103339 A |   | 6/2014 |
| JP | 2020-036048 A |   | 3/2020 |

OTHER PUBLICATIONS

Machine-generated English translation of JP 2004063860, total pp. 30 (Year: 2004).*

* cited by examiner

*Primary Examiner* — Bo B Jang
(74) *Attorney, Agent, or Firm* — Rabin & Berdo, P.C.

(57) ABSTRACT

A semiconductor device, including: a semiconductor substrate formed of silicon carbide, components being formed at one surface of the semiconductor substrate; a periphery portion disposed at a pre-specified region of a periphery of the semiconductor substrate, the components not being formed at the periphery portion; and a plurality of trenches or portions of trenches formed at the periphery portion, an interior of each of the trenches being filled with a material with a different coefficient of thermal expansion from the silicon carbide.

4 Claims, 7 Drawing Sheets

SEMICONDUCTOR DEVICE AND SEMICONDUCTOR WAFER

CROSS-REFERENCE TO RELATED APPLICATION

This application is based on and claims priority under 35 USC 119 from Japanese Patent Application No. 2020-178408 filed on Oct. 23, 2020, the disclosure of which is incorporated by reference herein.

BACKGROUND

Technical Field

The present invention relates to a semiconductor device and a semiconductor wafer.

Related Art

In fabrication of semiconductor devices, it is usual to provide a region for formation of plural semiconductor devices (ICs) on a semiconductor wafer, fabricate the semiconductor devices as a batch and, when the semiconductor devices are completed, scribe or dice the semiconductor wafer to separate the individual semiconductor devices. Regions that serve as cleaving margins when a semiconductor wafer is scribed are required. Cleaving margins that act as partition lines partitioning the semiconductor devices on a semiconductor wafer are commonly referred to as scribe lines. Various investigations have been conducted in relation to scribing, constituting a whole technical field.

Conventional technologies relating to scribing include, for example, the disclosure of Japanese Patent Application Laid-Open (JP-A) No. 2014-103339. A semiconductor integrated circuit device according to this publication includes an upper layer embedded wiring layer on a multilayer embedded wiring layer, and a metal seal ring formed in a ring shape along end portions of the semiconductor substrate. In the semiconductor integrated circuit device according to this publication, the upper layer embedded wiring layer includes a lower layer main insulation film and, on the lower layer main insulation film, an etching stop insulation layer and an upper layer main insulation film. A crack induction ring is provided in regions at the outer side of the metal seal ring. The crack induction ring includes an air gap in embedding regions of the upper layer main insulation film along the seal ring. The air gap is formed by an aperture portion in the etching stop insulation layer and, below the aperture portion, a recess portion in an upper surface of the lower layer main insulation film. According to the semiconductor integrated circuit device with the structure described in this publication, cracks that are caused by an IC-dividing process such as dicing or the like may be prevented from crossing the seal ring and reaching the interiors of the ICs, and an increase in processing costs is avoided.

Silicon carbide (SiC) has become more widely used as a material of semiconductor wafers in recent years. Silicon carbide is a material that features high hardness and high heat resistance, and is chemically stable. High-purity silicon carbide has higher thermal conductivity than silicon (Si) and, because the band gap is wide, is used in metal oxide semiconductor FETs (MOSFETs) and the like, such as blue light-emitting diodes.

On the other hand, because silicon carbide is harder and more brittle than silicon, silicon carbide is characterized by poor machinability. Therefore, chipping may occur due to pressure during scribing of a silicon carbide wafer, the application of forces from outer periphery portions during handling of silicon carbide ICs, or the like. The meaning of the term "chipping" as used herein includes chipping of outer periphery portions (including unremoved regions of scribe lines). When chipping occurs, problems such as, for example, a deterioration in the withstand voltage characteristic of a silicon carbide IC and the like may occur. Once cracks are formed, due to pressure during scribing of a silicon carbide wafer, application of forces from outer periphery portions during handling of silicon carbide ICs or the like, the cracks may propagate as a result of subsequent manipulation and may reach active regions (component regions) of the silicon carbide ICs. That is, although silicon carbide ICs have the characteristic of maintaining withstand voltage in conditions with electric fields around ten times greater than for silicon ICs, circuit functions of silicon carbide ICs are more susceptible to the effects of chipping from IC outer periphery portions.

In this regard, cracks that form during dicing are a problem even in JP-A No. 2014-103339. The crack induction ring including the air gap is provided in the embedding region of the upper layer main insulation film at which the recess portion is formed. However, the crack induction ring is not provided with the technical intention of restraining propagation of cracks with consideration for characteristics of the recess portion itself and the directions of cracks.

SUMMARY

In consideration of the circumstances described above, the present disclosure provides a semiconductor device and semiconductor wafer that may restrain the propagation of cracks formed at scribe lines in manipulation of the semiconductor device or semiconductor wafer.

A semiconductor device according to the present disclosure includes: a semiconductor substrate formed of silicon carbide, components being formed at one surface of the semiconductor substrate; a periphery portion disposed at a pre-specified region of a periphery of the semiconductor substrate, the components not being formed at the periphery portion; and a plurality of trenches or portions of trenches formed at the periphery portion, an interior of each of the trenches being filled with a material with a different coefficient of thermal expansion from the silicon carbide.

Another semiconductor device according to the present disclosure includes: a semiconductor substrate formed of silicon carbide with a 4H—SiC crystal structure, components being formed at one surface of the semiconductor substrate, and the semiconductor substrate being formed in a rectangular shape in plan view; a periphery portion disposed at a pre-specified region of a periphery of the semiconductor substrate, the components not being formed at the periphery portion; and a plurality of trenches or portions of trenches formed at the periphery portion, each of the trenches being formed in a polygonal shape in plan view, wherein a side of the semiconductor substrate in one direction is parallel with a direction of a crystal axis of the crystal structure, and at least one side in plan view of each of the trenches is orthogonal to the direction of the crystal axis.

A semiconductor wafer according to the present disclosure is formed of silicon carbide, a plurality of semiconductor devices being formed at one surface of the semiconductor wafer, and the semiconductor wafer includes: a scribe line partitioning the semiconductor devices; and a plurality of trenches formed in the scribe line, interiors of the trenches being filled with a material with a different coefficient of thermal expansion from the silicon carbide.

According to the present disclosure, an effect is provided in that a semiconductor device and semiconductor wafer may be provided that may restrain the propagation of cracks formed at scribe lines in manipulation of the semiconductor device or semiconductor wafer.

BRIEF DESCRIPTION OF THE DRAWINGS

Exemplary embodiments of the present invention will be described in detail based on the following figures, wherein.

DETAILED DESCRIPTION

Below, exemplary embodiments of the present disclosure are described in detail with reference to the attached drawings.

First Exemplary Embodiment

Figure 1A:
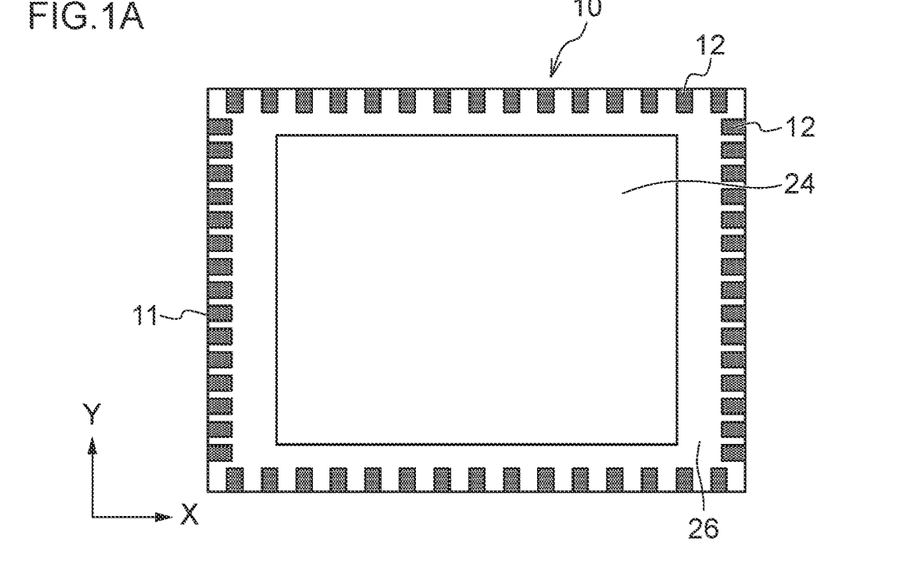
FIG. 1A is a plan view showing an example of structures of a semiconductor device according to a first exemplary embodiment.
Figure 1B:
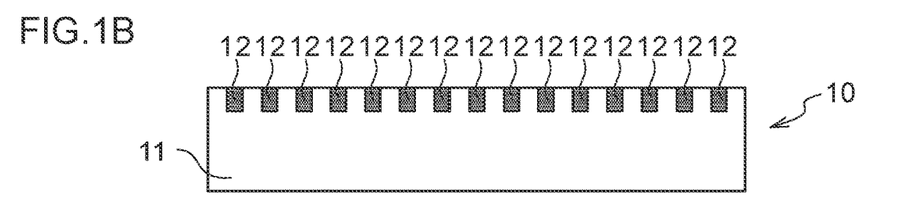
FIG. 1B is a side view showing an example of structures of the semiconductor device according to the first exemplary embodiment.
Figure 1C:
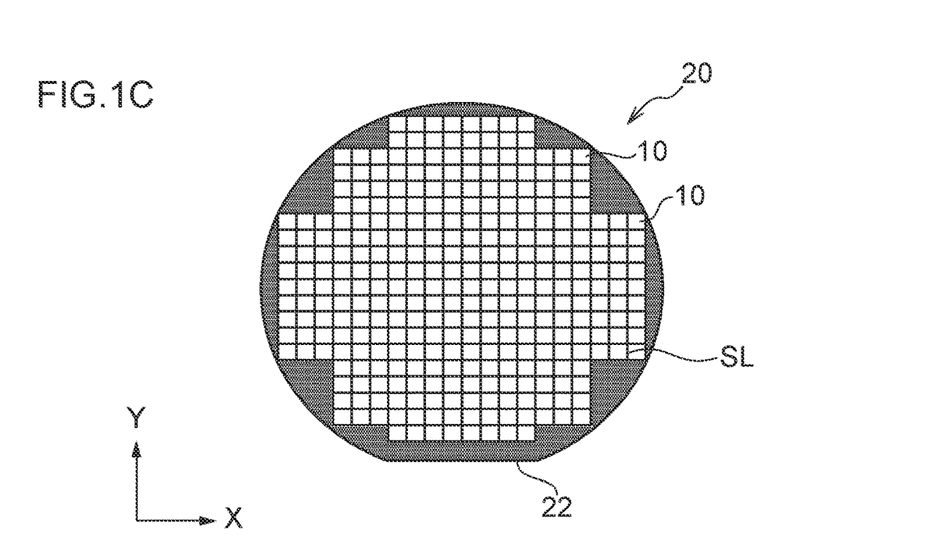
FIG. 1C is a plan view of a semiconductor wafer according to the first exemplary embodiment.

A semiconductor device 10 and semiconductor wafer 20 according to the present exemplary embodiment are described with reference to FIG. 1A to FIG. 3B. As shown in FIG. 1A, the semiconductor device 10 includes a semiconductor substrate 11, a component region 24, a periphery portion 26 and isolated trenches 12. As shown in FIG. 1C, a plural number of the semiconductor device 10, partitioned by scribe lines SL, are formed in the semiconductor wafer 20.

The component region 24 is a region in which various components (for example, circuit components) that realize functions of the semiconductor device 10 are formed. The periphery portion 26 is a region at the scribe lines SL that partially remains when the semiconductor wafer 20 is cleaved along the scribe lines SL. As shown in FIG. 1B, the trenches 12 are formed to a predetermined depth from one surface of the semiconductor substrate 11. Interiors of the trenches 12 are filled with a material (not shown in the drawings) with a different coefficient of thermal expansion from silicon carbide. As shown in FIG. 1A, along the whole circumference of the periphery portion 26 in a plan view of the semiconductor device 10, a plural number of the trenches 12 are formed.

As shown in FIG. 1C, the plural semiconductor devices 10 formed on the semiconductor wafer 20 are separated by widths of the scribe lines SL and partitioned from one another. The sides of each semiconductor device 10, which is formed as a rectangle, are arranged in parallel with an X axis and a Y axis. An orientation flat 22, which is arranged in parallel with the X-axis direction, is an indicator showing the direction of a crystal axis. Silicon carbide with a 4H—SiC crystal structure is used for the semiconductor wafer 20 in the present exemplary embodiment. The orientation flat 22 shows the direction of any one of the crystal axes of the silicon carbide (an a1 axis, a2 axis or an a3 axis). One side of each rectangular semiconductor device 10 in the present exemplary embodiment is arranged so as to be parallel with the orientation flat 22. Thus, the sides of the semiconductor devices 10 in one direction are arranged in parallel with the crystal axis of the semiconductor wafer 20.

As mentioned above, in a semiconductor device or semiconductor wafer according to a conventional technology, restraint of the propagation of cracks formed at scribe lines in manipulation of the semiconductor device or semiconductor wafer is called for. Accordingly, in the semiconductor device 10 and semiconductor wafer 20 according to the present exemplary embodiment, the plural trenches 12 are compactly formed inside the scribe lines SL, and the interiors of the trenches 12 are filled with the material with a different coefficient of thermal expansion from the silicon carbide.

Figure 2:
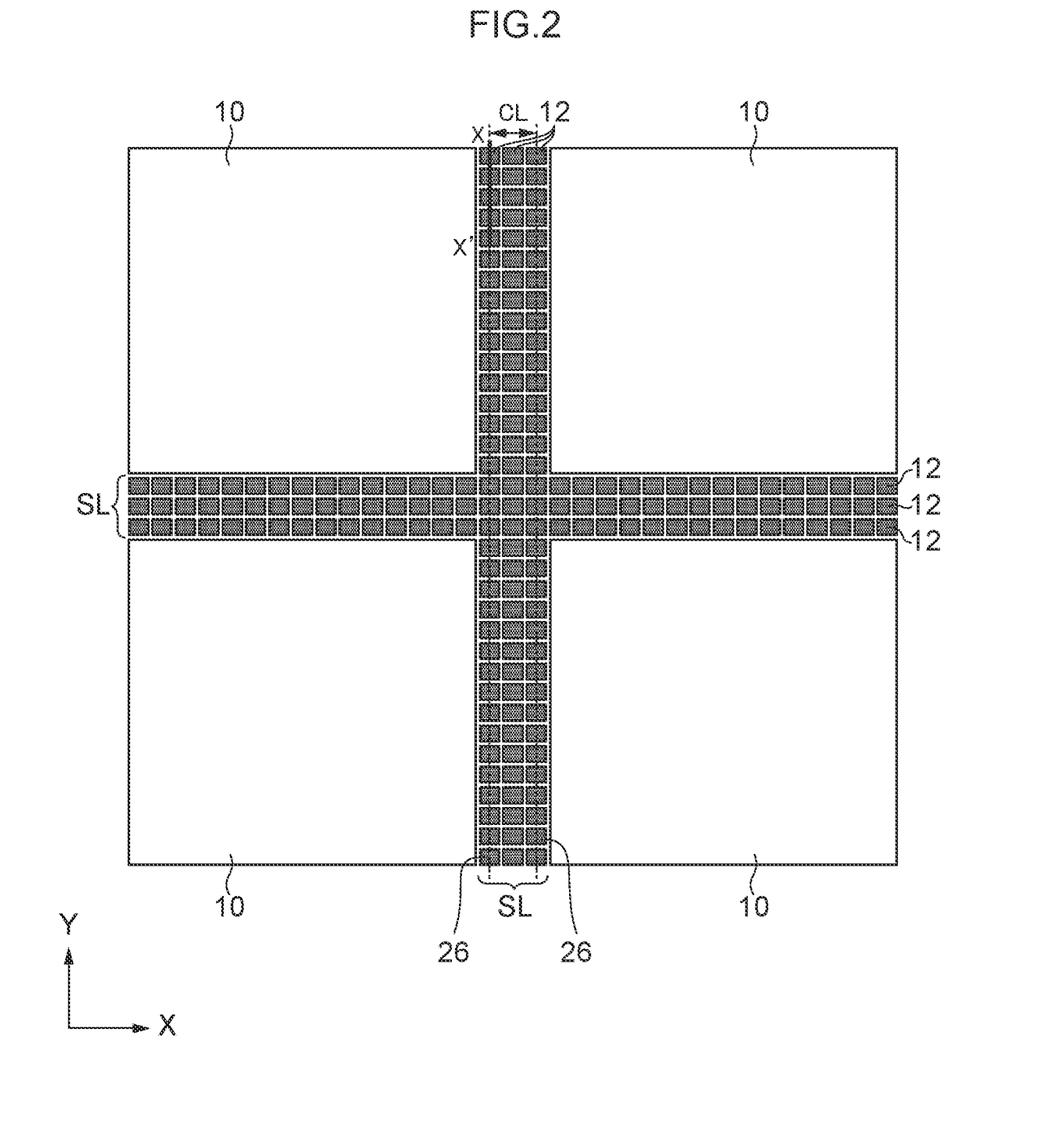
FIG. 2 is a plan view showing an example of structures of the semiconductor wafer according to the first exemplary embodiment.

The structure of each scribe line SL of the semiconductor wafer 20 is more specifically described with reference to FIG. 2. FIG. 2 shows a portion of the semiconductor wafer 20 shown in FIG. 1C (below referred to as a wafer portion), and shows the scribe lines SL between four of the semiconductor devices 10. Strictly speaking, each semiconductor device 10 includes the periphery portion 26, but this adds to complexity of drawing. Therefore, in FIG. 2, a region corresponding to the component region 24 is depicted as being the semiconductor device 10. The same applies to wafer portions illustrated below. As shown in FIG. 2, the scribe lines SL are provided extending in the X-axis direction and the Y-axis direction between the corresponding semiconductor devices 10. Plural numbers of the trenches 12 are compactly formed inside the scribe lines SL. The trenches 12 according to the present exemplary embodiment are formed in substantially square shapes. The width of each scribe line SL in the present exemplary embodiment is set to, for example, 100 μm, the length of one side of each of the trenches 12 is a few microns, and the depth of each of the trenches 12 is 1 to 2 μm. Therefore, the trenches 12 may be compactly arranged on the scribe lines SL. However, the widths of the scribe lines SL and the sizes of the trenches 12 are not limited thus. As described in more detail below, suitable values may be selected in consideration of the size of the semiconductor wafer 20, the sizes of the semiconductor devices 10 and the like, principally such that cracks forming in the scribe lines SL may be arrested effectively.

A cleavage region CL shown in FIG. 2 is actually removed when the semiconductor wafer 20 is scribed, and represents a region that does not remain at each semiconductor device 10. Regions of the scribe lines SL excluding the cleavage regions CL are in the periphery portions 26. Regions other than the periphery portion 26 are in the component region 24 (not shown in the drawing). The component region 24 may include both a region in which components are actually formed and, for example, a buffer region in which components are not formed, which is provided in order to alleviate the effects of cracks. When the semiconductor wafer 20 is scribed along the scribe lines SL, the trenches 12 or portions of the trenches 12 remain at the periphery portion 26. The more of the trenches 12 are left in the periphery portion 26, the closer the trenches 12 are disposed to the component region 24. In FIG. 2, a structure is illustrated in which the trenches 12 are arranged across the whole area of each scribe line SL, but this is not limiting. For example, the trenches 12 need not be arranged in the cleavage region CL.

Figure 3A:
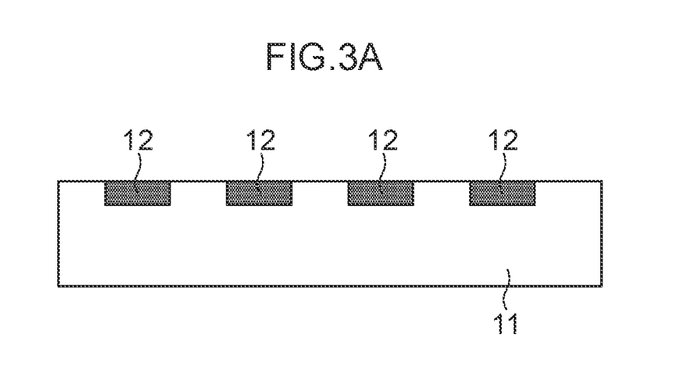
FIG. 3A is a sectional view cut along a cleavage line of the semiconductor wafer according to the first exemplary embodiment.

Operation of the trenches 12 according to the present exemplary embodiment is described with reference to FIG. 3A and FIG. 3B. FIG. 3A is a sectional diagram cut along line X-X' shown in FIG. 2, which is to say a sectional diagram cut along the cleavage region CL. In FIG. 3A, it can be seen that the trenches 12 are formed with a predetermined depth from the one surface of the semiconductor wafer 20. In other words, FIG. 3A shows the same side view as FIG. 1B. The interior of each of the trenches 12 is filled with the material (which may be referred to below as "the filler material") with a different coefficient of thermal expansion from the silicon carbide, for example, an oxide film.

Because the trenches 12 according to the present exemplary embodiment have the structure described above, in a fabrication process of the semiconductor wafer 20, when another step of heat processing is carried out after the trenches 12 are formed, the material in the trenches 12 thermally expands by a different amount from the silicon carbide. As a result, crack-like distortions (for example, crystal defects) occur at portions of the trenches 12. These distortions tend to occur at the corners of the substantially square trenches 12, because stresses caused by the difference in thermal expansion of the silicon carbide and the filler material tend to concentrate at the corners of the trenches 12. With a view to facilitating the formation of the distortions at the trenches 12, it is preferable if a coefficient of thermal expansion of the filler material is greater than a coefficient of thermal expansion of the silicon carbide.

Figure 3B:
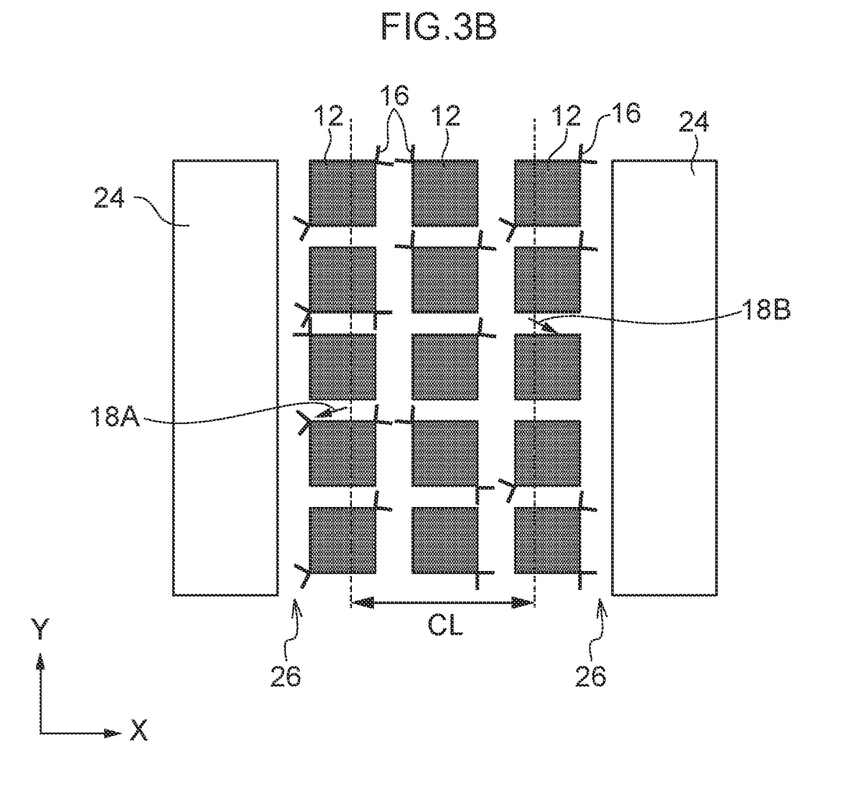
FIG. 3B is a plan view describing an operation that arrests a crack at a trench.

FIG. 3B schematically illustrates a state in which distortions 16 occur at the corners of the trenches 12. With regard to ease of viewing of FIG. 3B, the distortions 16 are depicted intermittently, but in actuality the distortions 16 would occur at almost every corner. As illustrated in FIG. 3B, if a crack 18A (below referred to as the crack 18 when the crack is not being specified) forms in scribing of the semiconductor wafer 20 or manipulation of the semiconductor wafer 20, the crack 18A is arrested (terminated) at the distortion 16 that is located in a propagation direction of the crack 18A. FIG. 3B depicts an example in which portions of the trenches 12 remain at the periphery portion 26. However, if numerous complete trenches 12 are left in the periphery portion 26 due to the sizes of the trenches 12 being made smaller, a greater number of the distortions 16 may be arranged in the periphery portion 26. As a result, the distortions 16 may lie in the propagation directions of more cracks.

Particularly if the cracks 18 form during handling of ICs in a state after the semiconductor wafer 20 has been divided into the semiconductor devices 10, the cracks 18 that form are arrested by the distortions 16, similarly to operation of the distortions 16 in the fabrication process of the semiconductor wafer 20. In the semiconductor device 10 according to the present exemplary embodiment, because the cracks 18 that form at the scribe lines SL in the fabrication process of the semiconductor wafer 20 have a high probability of being arrested effectively, the probability of new cracks 18 forming in the divided state of the semiconductor devices 10 is likely to be lowered.

The cracks 18 forming at the scribe lines SL may be arrested at surfaces of the trenches 12 as well as at the distortions 16. A crack 18B shown in FIG. 3B is arrested by a surface of the trench 12. Modes in which the cracks 18 are arrested at the surfaces of the trenches 12 are described in more detail below.

Now, a method of fabrication of the semiconductor device 10 and semiconductor wafer 20 according to the present exemplary embodiment is schematically described.

(1) Trench Formation

Trenches are formed at the scribe lines SL of the semiconductor wafer 20. As described above, the trenches 12 are formed only in regions corresponding with the periphery portions 26 (regions intended to be periphery portions) and need not be formed at the cleavage regions CL. When the shapes of the trenches 12 are substantially square, for example, the lengths of the sides are set to a few microns and the depths to 1 to 2 μm. When the shapes of the trenches 12 are rectangular, for example, the short sides are set to at least a few microns. If the widths of the trenches 12 are narrow, there is a possibility of the filler material not completely filling the interiors of the trenches 12.

(2) Oxide Film Formation

The interiors of the trenches 12 are subsequently filled with the filler material. The filler material is formed as, for example, an oxide film. The oxide film includes, for example, $SiO_2$.

(3) Heat Treatment

Subsequently, a heat treatment, for example, for activating diffusion layers is conducted at a temperature of, for example, 1200° C. to 1700° C. The distortions 16 are formed in this heat treatment process.

(4) Scribing

The semiconductor wafer 20 is scribed along the scribe lines SL and is divided into the semiconductor devices 10. The trenches 12 or portions of the trenches 12 remain at the periphery portion 26 of each semiconductor device 10.

(5) Assembly

Assembly such as mounting the semiconductor devices 10 in packages and the like is carried out.

According to the semiconductor device 10 and semiconductor wafer 20 according to the present exemplary embodiment as described in detail above, the propagation of cracks formed at scribe lines in manipulation of the semiconductor device or semiconductor wafer may be restrained.

Second Exemplary Embodiment

Figure 4:
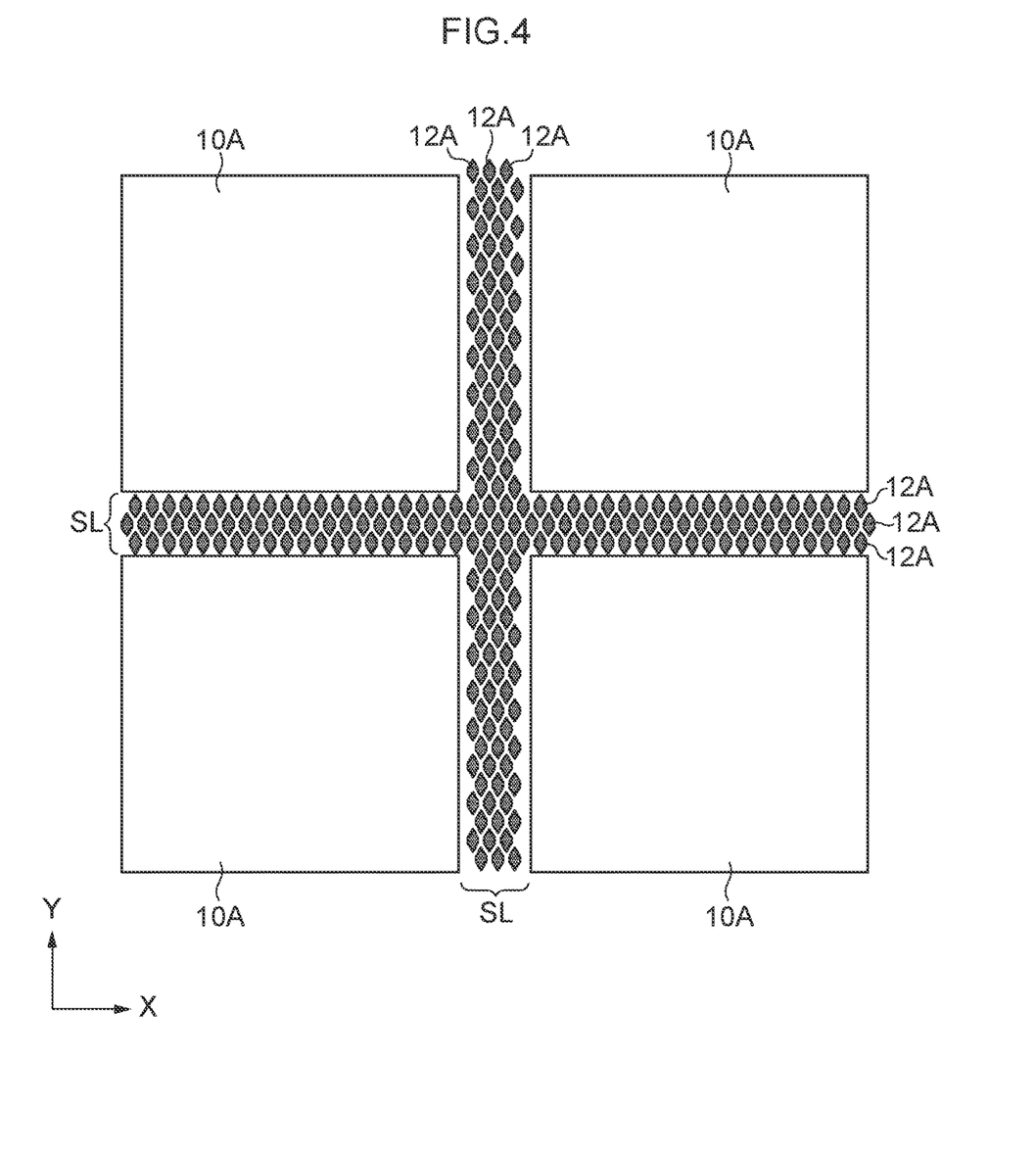
FIG. 4 is a plan view showing an example of structures of a semiconductor wafer according to a second exemplary embodiment.

A semiconductor device and semiconductor wafer according to the present exemplary embodiment are described with reference to FIG. 4 to FIG. 5B. FIG. 4 shows a wafer portion of the semiconductor wafer according to the present exemplary embodiment. In the wafer portion shown in FIG. 4, the direction of the straight line of the orientation flat 22 is in the X-axis direction. That is, the orientation of the drawing corresponds with the semiconductor wafer 20 shown in FIG. 1C. The present exemplary embodiment is a mode in which the shapes of the trenches are changed from the exemplary embodiment described above. Accordingly, structures of the semiconductor wafer are the same as in FIG. 1C and are not shown in these drawings.

As shown in FIG. 4, in the semiconductor wafer according to the present exemplary embodiment, plural trenches 12A whose shapes are substantially regular hexagon shapes are compactly formed at the scribe lines. Similarly to the trenches 12, the interior of each of the trenches 12A is filled with a material with a different coefficient of thermal expansion from the silicon carbide. When the semiconductor wafer according to the present exemplary embodiment is scribed along the scribe lines SL and divided, semiconductor devices 10A are formed. The trenches 12A in substantially rectangular hexagon shapes, or portions of the trenches 12A, remain in the periphery portion 26 (not shown in the drawings) of each semiconductor device 10A.

In a fabrication process of the semiconductor device 10A and semiconductor wafer according to the present exemplary embodiment, the distortions 16 are formed principally at corners of the trenches 12A. Similarly to the exemplary embodiment described above, the distortions 16 arrest the cracks 18 that form at the scribe lines SL. The semiconductor device 10A and semiconductor wafer according to the present exemplary embodiment provide more effective arresting of the cracks 18 by surfaces of the trenches 12A in addition to arresting of the cracks 18 by the distortions 16. Therefore, in the semiconductor wafer according to the present exemplary embodiment, consideration is given to the orientation of each of the trenches 12A relative to the orientation flat 22.

Figure 5A:
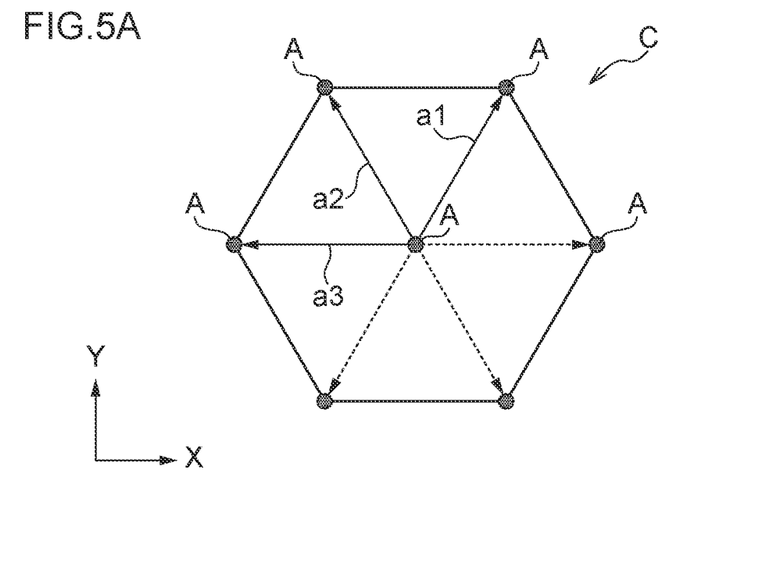
FIG. 5A is a diagram describing a crystal structure of silicon carbide.

Now, crystal structure of the silicon carbide is briefly described with reference to FIG. 5A and FIG. 5B. FIG. 5A shows a (0001) plane of a crystal structure C of the 4H—SiC crystal structure employed in the semiconductor wafer according to the present exemplary embodiment. The reference symbols A shown in FIG. 5A indicate atoms (silicon or carbon). As shown in FIG. 5A, the crystal structure C has crystal axes in three directions, an a1 axis, a2 axis and a3 axis. The direction of the orientation flat 22 of the semiconductor wafer according to the present exemplary embodiment is set to the direction of the a3 axis. However, a crystal axis that matches the direction of the orientation flat 22 could similarly be the a1 axis or the a2 axis.

Figure 5B:
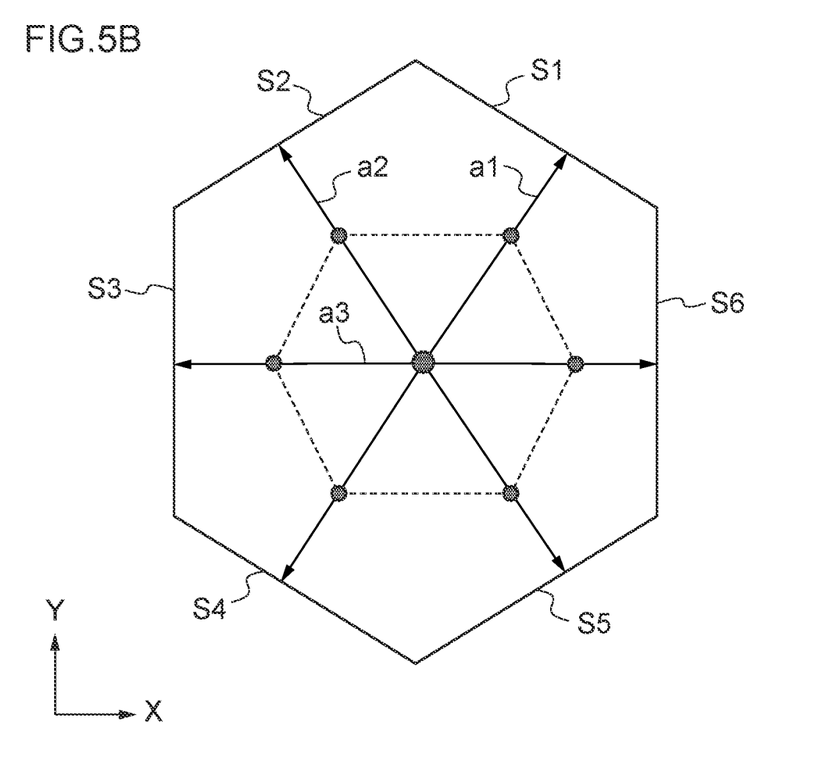
FIG. 5B is a diagram describing a relationship between a shape of a trench according to the second exemplary embodiment and a direction of a crystal axis of the silicon carbide.

FIG. 5B is a diagram depicting a relationship between the orientation of the trench 12A and the orientation of the crystal structure C. As shown in FIG. 5B, the trench 12A has six surfaces, S1, S2, S3, S4, S5 and S6. The a1 axis is orthogonal to the surfaces S1 and S4, the a2 axis is orthogonal to the surfaces S2 and S5, and the a3 axis is orthogonal to the surfaces S3 and S6. The surfaces referred to in the present exemplary embodiment are sectional surfaces cut in the depth direction along the lines indicated by the reference symbols S1 to S6.

A silicon carbide crystal has the characteristic of breaking easily along the direction of a crystal axis. Accordingly, in the present exemplary embodiment the directions of the crystal axes are orthogonal to the depth direction surfaces of each of the trenches 12A as described above. Therefore, even when the cracks 18 occur, there is a high probability of each crack 18 being arrested by a surface of the trench 12A that lies on the direction of the crack 18. Thus, according to the semiconductor device 10A and semiconductor wafer according to the present exemplary embodiment, consideration is given to both arresting of cracks by the distortions and arresting of cracks by the surfaces of the trenches. Thus, the propagation of cracks formed at scribe lines may be restrained more effectively in manipulation of the semiconductor device or semiconductor wafer.

Third Exemplary Embodiment

Figure 6:
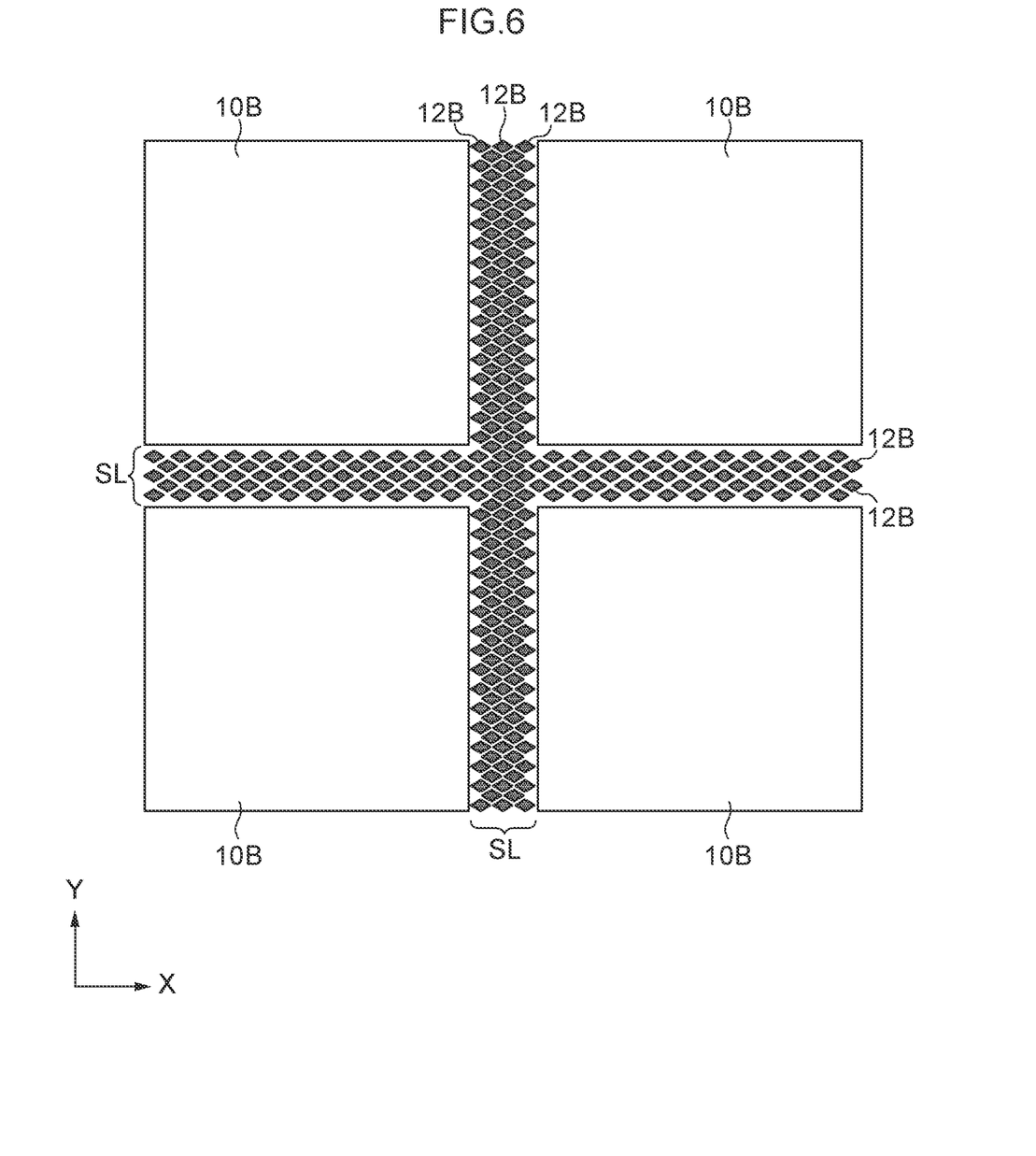
FIG. 6 is a plan view showing an example of structures of a semiconductor wafer according to a third exemplary embodiment.

A semiconductor device and semiconductor wafer according to the present exemplary embodiment are described with reference to FIG. 6 and FIG. 7. FIG. 6 shows a wafer portion of the semiconductor wafer according to the present exemplary embodiment. In the wafer portion shown in FIG. 6, the direction of the straight line of the orientation flat 22 is in the X-axis direction. That is, the orientation of the drawing corresponds with the semiconductor wafer 20 shown in FIG. 1C. The present exemplary embodiment is a mode in which the shapes of the trenches are changed from the first exemplary embodiment. Accordingly, structures of the semiconductor wafer are the same as in the first exemplary embodiment and are not shown in these drawings.

As shown in FIG. 6, in the semiconductor wafer according to the present exemplary embodiment, plural trenches 12B whose shapes are rhombus shapes are compactly formed at the scribe lines. Similarly to the trenches 12, the interior of each of the trenches 12B is filled with a material with a different coefficient of thermal expansion from the silicon carbide. When the semiconductor wafer according to the present exemplary embodiment is divided along the scribe lines SL, semiconductor devices 10B are formed. The trenches 12B in rhombus shapes or portions of the trenches 12B remain in the periphery portion 26 (not shown in the drawings) of each semiconductor device 10B.

In a fabrication process of the semiconductor device 10B and semiconductor wafer according to the present exemplary embodiment, the distortions 16 are formed principally at corners of the trenches 12B and, similarly to the first exemplary embodiment, the distortions 16 arrest the cracks 18 that form at the scribe lines SL. The semiconductor device 10B and semiconductor wafer according to the present exemplary embodiment provide more effective arresting of the cracks 18 by surfaces of the trenches 12B in addition to arresting of the cracks 18 by the distortions 16. Thus, in the semiconductor wafer according to the present exemplary embodiment, consideration is given to the orientation of each of the trenches 12B relative to the orientation flat 22.

Figure 7:
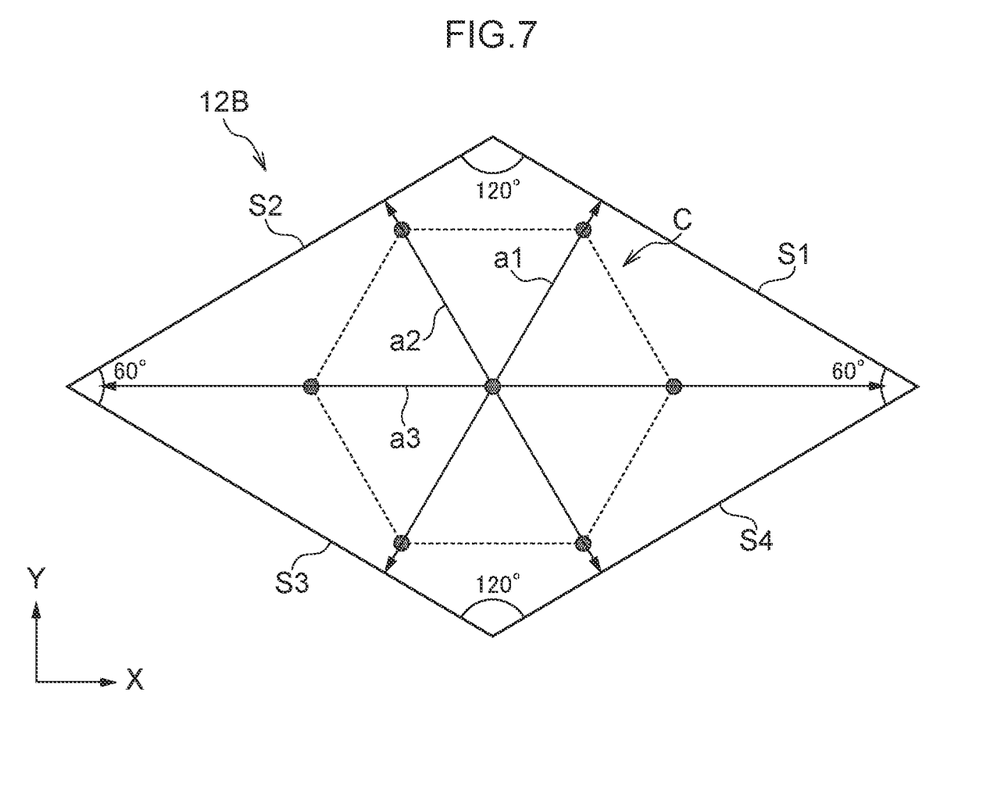
FIG. 7 is a diagram describing a relationship between a shape of a trench according to the third exemplary embodiment and the direction of a crystal axis of the silicon carbide.

As shown in FIG. 7, the shape of each of the trenches 12B is a rhombus shape with internal angles of 60° and 120°. A diagonal linking the two 60° vertices is in the X-axis direction. The basic concept of the present exemplary embodiment is the same as in the second exemplary embodiment described above, with the orientation of the trench 12B relative to the orientation flat 22 being specified such that the directions of crystal axes, in which the cracks 18 are likely to form, are orthogonal to the surfaces of the trench 12B. FIG. 7 shows a relationship between the orientation of the trench 12B and the orientation of the crystal structure C. As shown in FIG. 7, the direction of the a3 axis of the crystal structure C is in the direction of the orientation flat 22 (see FIG. 1C). When the trenches 12B are arranged as described above, surfaces S1 and S3 are orthogonal to the a1 axis and surfaces S2 and S4 are orthogonal to the a2 axis. Therefore, for the same reason as in the second exemplary embodiment, the propagation of cracks 18 that form at the scribe lines SL may be restrained.

As shown in FIG. 7, of the vertices of the trench 12B, the vertices with 60° angles are arranged in the direction of the a3 axis and surfaces are not disposed at these vertices. However, because the 60° angles of these vertices are acute angles, the distortions 16 are expected to occur more easily at the 60° vertices. Therefore, probabilities of the cracks 18 that are in the direction linking the two 60° vertices of the trench 12B being arrested by the distortions 16 are higher.

Thus, according to the semiconductor device and semiconductor wafer according to the present exemplary embodiment, consideration is given to both arresting of cracks by the distortions and arresting of cracks by the surfaces of the trenches. Thus, the propagation of cracks formed at scribe lines may be restrained more effectively in manipulation of the semiconductor device or semiconductor wafer.

In the exemplary embodiments described above, semiconductor devices and semiconductor wafers that employ silicon carbide are illustrated and described. However, materials constituting the semiconductor devices and semiconductor wafers are not limited only to silicon carbide; alternative materials such as silicon, gallium arsenide and the like may similarly apply the technical intention of the present application.

In the exemplary embodiments described above, trenches in square shapes, regular hexagon shapes and rhombus shapes in plan view are illustrated and described, but this is not limiting; trenches with polygonal shapes may ordinarily be employed. Moreover, the trenches are not limited to polygonal shapes. The trenches may be formed in alternative shapes such as, for example, triangles, circles, ellipses and the like, with consideration for the ease of occurrence of distortions, ease of formation of the trenches and so forth.

In the exemplary embodiments described above, modes in which trenches of one shape are arranged at the scribe lines are illustrated and described, but this is not limiting; trenches of plural shapes may be arranged in combination. For example, the above-mentioned trenches with regular hexagon shapes and trenches with rhombus shapes may be arranged at the scribe lines in combination, with consideration for ease of arrangement and the like. Further, when one kind of trench is arranged, the individual trenches may be arranged with different orientations as required.

In the exemplary embodiments described above, modes in which the trenches 12 are filled with the filler material are illustrated and described, but this is not limiting; cavity structures that are not filled with anything are applicable. Even when the trenches 12 are formed as cavities, the cracks 18 may be arrested by the surfaces of the trenches 12.

What is claimed is:

1. A semiconductor device comprising:
a semiconductor substrate formed of silicon carbide with a 4H—SiC crystal structure, components being formed at one surface of the semiconductor substrate, and the semiconductor substrate being formed in a rectangular shape in plan view;
a periphery portion disposed at a pre-specified region of a periphery of the semiconductor substrate, the components not being formed at the periphery portion; and
a plurality of trenches or portions of trenches formed at the periphery portion, each of the trenches being formed in a polygonal shape in plan view,
wherein a side of the semiconductor substrate in one direction is parallel with a direction of a crystal axis of the crystal structure, and at least one side in plan view of each of the trenches is orthogonal to the direction of the crystal axis.

2. The semiconductor device according to claim 1, wherein the shape in plan view of each of the trenches is a regular hexagon shape.

3. The semiconductor device according to claim 1, wherein the shape in plan view of each of the trenches is a rhombus with 60° internal angles and 120° internal angles, and a diagonal linking vertices with the 60° internal angles of each of the trenches is parallel with the direction of the crystal axis.

4. A semiconductor wafer formed of silicon carbide, a plurality of semiconductor devices being formed at one surface of the semiconductor wafer, and the semiconductor wafer comprising:
a scribe line partitioning the semiconductor devices; and
a plurality of trenches formed in the scribe line, interiors of the trenches being filled with a material with a coefficient of thermal expansion different from a coefficient of thermal expansion of the silicon carbide,
wherein each of the semiconductor devices comprises:
a semiconductor substrate formed of silicon carbide with a 4H—SiC crystal structure, components being formed at one surface of the semiconductor substrate, and the semiconductor substrate being formed in a rectangular shape in plan view;
a periphery portion disposed at a pre-specified region of a periphery of the semiconductor substrate, the components not being formed at the periphery portion; and
the plurality of trenches or portions of the trenches formed at the periphery portion, each of the trenches being formed in a polygonal shape in plan view,
wherein a side of the semiconductor substrate in one direction is parallel with a direction of a crystal axis of the crystal structure, and at least one side in plan view of each of the trenches is orthogonal to the direction of the crystal axis.

* * * * *